United States Patent [19]

Ohta et al.

[11] Patent Number: 5,223,080
[45] Date of Patent: Jun. 29, 1993

[54] METHOD FOR CONTROLLING THICKNESS OF SINGLE CRYSTAL THIN-FILM LAYER IN SOI SUBSTRATE

[75] Inventors: Yutaka Ohta; Masatake Katayama; Takao Abe, all of Gunma; Yasuaki Nakazato, Nagano, all of Japan

[73] Assignee: Shin-Etsu Handotai Co., Ltd., Japan

[21] Appl. No.: 799,182

[22] Filed: Nov. 27, 1991

[30] Foreign Application Priority Data

Nov. 28, 1990 [JP] Japan .................. 2-332867

[51] Int. Cl.$^5$ ............... H01L 21/306; B44C 1/22; C03C 15/00; C03C 25/06
[52] U.S. Cl. .................... 156/626; 156/643; 156/646; 156/657; 156/662; 156/345
[58] Field of Search ............ 156/626, 643, 646, 651, 156/656, 657, 662, 345, 630, 633; 437/225, 226, 228, 233, 238

[56] References Cited

U.S. PATENT DOCUMENTS

| | | | |
|---|---|---|---|
| 4,367,044 | 1/1983 | Booth et al. | 156/626 X |
| 4,717,446 | 1/1988 | Nagy et al. | 156/626 |
| 5,131,752 | 7/1992 | Yu et al. | 356/369 |

Primary Examiner—William A. Powell
Attorney, Agent, or Firm—Townsend, Snider & Banta

[57] ABSTRACT

A method for controlling the thickness of a single crystal thin-film silicon layer bonded on a dielectric substrate in a SOI substrate thereby effecting conversion of said single crystal silicon layer to a thin film is disclosed. To be more precise, said method comprises selectively and hypothetically dividing the entire surface of said single crystal silicon layer destined to undergo a chemical vapor-phase corrosion reaction for the sake of said conversion into necessary minute sections and, at the sametime, taking preparatory measurement of the thickness of said single crystal silicon layer in each of said minute sections, and effecting on each of said minute sections said conversion to a thin film by a chemical vapor-phase corrosion reaction adjusted in accordance with the measured thickness of layer. The conversion to a thin film is attained with the dispersion of thickness of the single crystal silicon layer controlled with high accuracy.

12 Claims, 3 Drawing Sheets

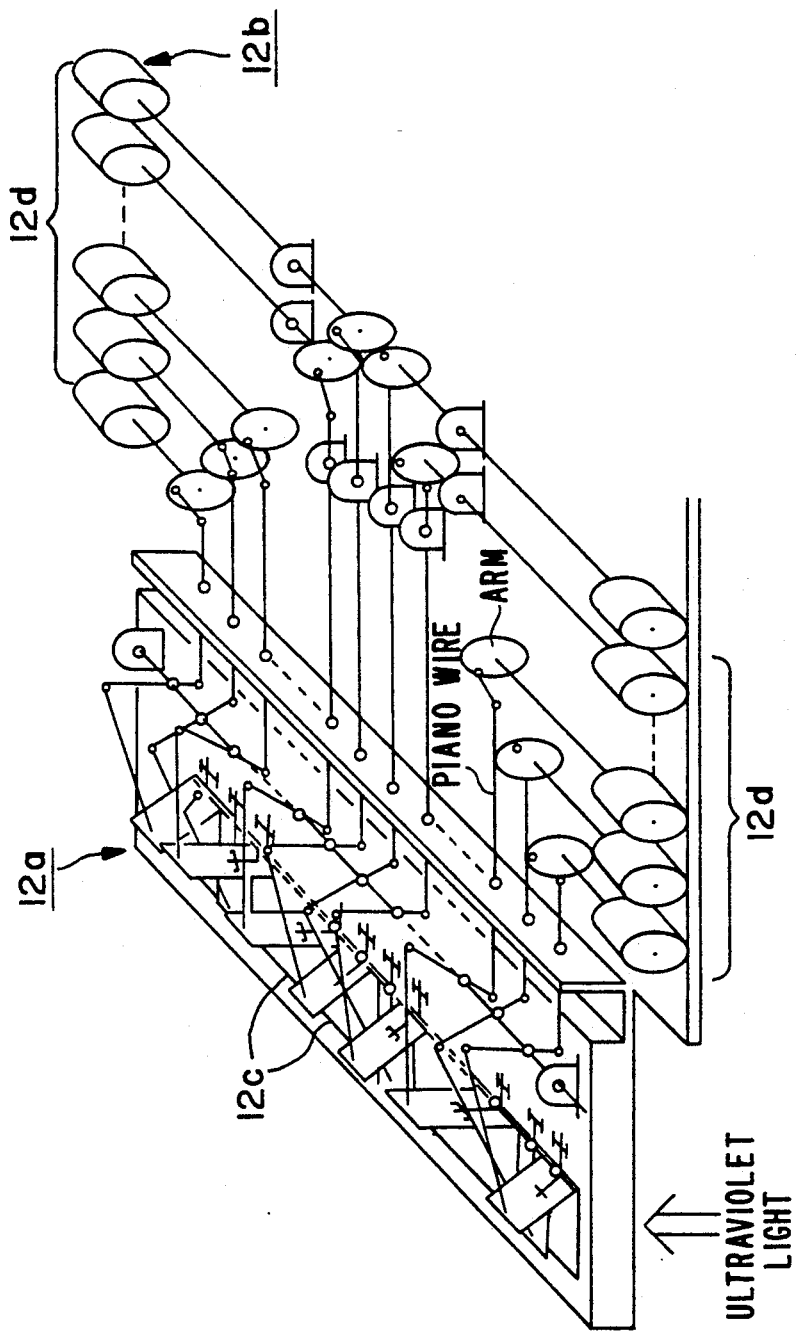

METHOD FOR CONTROLLING THICKNESS OF SINGLE CRYSTAL THIN-FILM LAYER IN SOI SUBSTRATE

BACKGROUND OF THE INVENTION

1. Field of the Invention

This invention relates to a method for controlling the thickness of a single crystal thin film layer in an SOI (silicon on insulator) substrate. More particularly this invention relates to a method for controlling the thickness of a single crystal silicon layer bonded to a dielectric substrate to ensure formation of the single crystal silicon layer in the form of a thin film.

2. Description of the Prior Art

Heretofore, for the purpose of ensuring production of the single crystal silicon layer bonded to the dielectric substrate of this kind in the form of a thin layer, generally the following various means have been proposed.

As the first means for the formation of a single crystal silicon thin-film layer on a dielectric substrate, the so-colled SOS (silicon on sapphire) method, namely the technique of causing a single crystal silicon layer to be epitaxially grown on a single crystal sapphire substrate, has been well known.

This SOS method, however, is short of practicality because numerous crystal defects are liable to occur during the vapor-phase silicon growth owing to the mismatch in lattice constant between the sapphire and the single crystal of silicon in the process of vapor-phase growth.

As the second means, the technique which comprises forming a thermal oxide film on the surface of a silicon substrate and, at the same time, depositing a polycrystalline or amorphous silicon film on the thermal oxide film and then irradiating the thermal oxide film in a linear pattern with an energy beam such as an electron beam or a laser beam and, at the same time, moving the direction of this irradiation gradually in a scanning pattern in the perpendicular direction thereby fusing and solidifying the silicon layer and forming single crystal thin-film on the entire surface of the substrate has been disclosed in Japanese Patent Publciation SHO 62(1987)-34,716.

In this known technique, a single crystal projection is exposed in the terminal part of the single crystal silicon substrate and the conversion of the polycrystalline film into a single crystal is attained with the projection as a core. This technique in its existent state is sparingly capable of producing a single crystal silicon thin layer fit for practical use, though the interaction between the fused silicon and the oxide film permits the conversion into the single crystal to be effected partly.

As the third means, the so-called SIMOX (separation by implantation oxygen) method, namely the technique of implanting oxygen ions in a silicon substrate by the use of an ion-implanting device and then subjecting the silicon substrate to an annealing treatment thereby forming an oxide film layer in the part at a specific depth inside the silicon substrate has been well known.

Again this technique is hardly fit for practical use in its existent state because the crystal defects produced by the implantation of ions defy restoration.

In recent years, therefore, the wafer of the so-called bonded SOI (silicon on insulator) construction has come to attract special attention.

The wafer of this bonded SOI construction is fabricated by preparing two single crystal silicon wafers, subjecting at least either of the silicon wafers to an oxidizing treatment thereby forming an oxide film on the surface of the silicon wafer which has undergone the oxidizing treatment, superposing these two silicon wafers on each other in such a manner that the oxide film formed on at least one silicon wafer will constitute itself an intermediate layer, heating the superposed silicon wafers to a prescribed temperature thereby bonding them, and subsequently polishing the upper layer side silicon wafer into a thin film (hereinafter, the one wafer subjected to the conversion into a thin film after the bonding shall be referred to as the "bond wafer" and the other wafer as the "base wafer").

One of the single crystal silicon wafers of the bonded SOI construction is replaced by quartz glass substrate mirror finish as the base wafer and a single crystal substrate furnished with no thermal oxide film as the same on the bond wafer.

In the single crystal silicon wafer of the conventional bonded SOI construction which is fabricated as described above, various minute devices are formed by the universally known technique for production of semiconductor integrated circuit elements on the single crystal silicon layer which has undergone the conversion into the thin film. Recently, the devices so formed are incessantly tending toward reduction in size and growth in density. Further, the single crystal silicon wafers which are used for special devices such as, for example, drive circuits in displays are required to be such that the single crystal silicon layers on the dielectric substrates should have their entire surfaces finished with high accuracy On the order of submicrons, namely the dispersion of thickness of the thin film layers across the substrate should fall within ±10% of the average film thickness.

This is because the dispersion of thickness of the single crystal silicon layer subjected to the conversion into thin film has a serious influence of causing a dispersion in the electrical properties of the component elements to be formed within the silicon layer.

In the conventional technique for the conversion into a thin film, however, the conversion of a single crystal silicon layer into a thin film is normally attained by the work of surface grinding or the work of mirror polishing. Further, in the work for the conversion into a thin film, it is the unbonded surface of the base wafer, namely the silicon substrate or quartz glass substrate that serves as the reference plane. For the purpose of enhancing the accuracy of thickness of the thin layer, therefore, first uncontrollability of thickness of the base wafer itself poses as a problem and then the processing accuracy of surface grinding performed on the bond wafer in the technique for mirror polishing poses as another problem. The accuracy of thickness of the silicon substrate or the quartz glass substrate destined to serve as the base wafer, in the existent state, is about ±0.30 μm at best. This point puts a serious technical obstacle in the way of producing a single crystal silicon wafer of the SOI construction furnished with a single crystal thin layer of high accuracy on the order of submicrons.

When the single crystal thin layer in the silicon wafer of the SOI construction is assumed to have an average thickness of 0.50 μm, for example, the possibility that this thin layer will have the largest thickness of about 0.80 μm and the smallest thickness of about 0.20 μm claims a recognition. The difference, 0.60 μm, between the two extreme thickness mentioned above exceeds the average thickness of the layer. When the single crystal thin layer in the silicon wafer of the SOI construction has an average thickness of not more than 0.50 μm, the possibility that part of the single crystal thin layer will be completely lost during the fabrication thereof by the conventional technique is not undeniable.

This invention has been realized for the purpose of solving the problems encountered by the prior art as described above. An object of this invention is to provide a method for the production of a silicon wafer of the SOI construction comprising a dielectric substrate and a thin layer of single crystal silicon bonded to the dielectric substrate and endowed with accuracy of thickness on the order of submicrons, which method enables the fabrication to be controlled with accuracy such that the dispersion of thickness of the single crystal silicon thin layer will fall within at least ±10% of the average thickness and, at the same time, ensures infallible retention of the required single crystal quality in the thin layer before and after the fabrication. This method particularly is directed to controlling the thickness of the single crystal thin layer in the SOI substrate.

SUMMARY OF THE INVENTION

The object of the present invention described above is accomplished, in the production of a silicon wafer of the SOI construction furnished with an extremely thin layer, by a method for controlling the film thickness of a single crystal silicon layer bonded to a dielectric substrate thereby effecting conversion of the single crystal silicon layer to a thin film, which method is characterized by preparatorily dividing selectively and hypothetically the entire surface of the single crystal silicon layer subjected to a chemical vapor-phase corroding reaction for the conversion to a thin film into necessary minute sections and, at the same time, measuring the thickness of the single crystal silicon layer in each of the minute sections, and causing the minute sections severally to undergo simultaneously the conversion to a thin film and the control of dispersion of the thickness of thin film with high accuracy by the chemical vapor-phase corroding action carried out as adjusted in accodance with the measured thickness of the layer.

BRIEF DESCRIPTION OF THE DRAWINGS

FIG. 5 is a perspective explanatory drawing illustrating in type the general construction of a mechanical shutter mechanism as used similarly.

DESCRIPTION OF THE PREFERRED EMBODIMENTS

Figure 1:
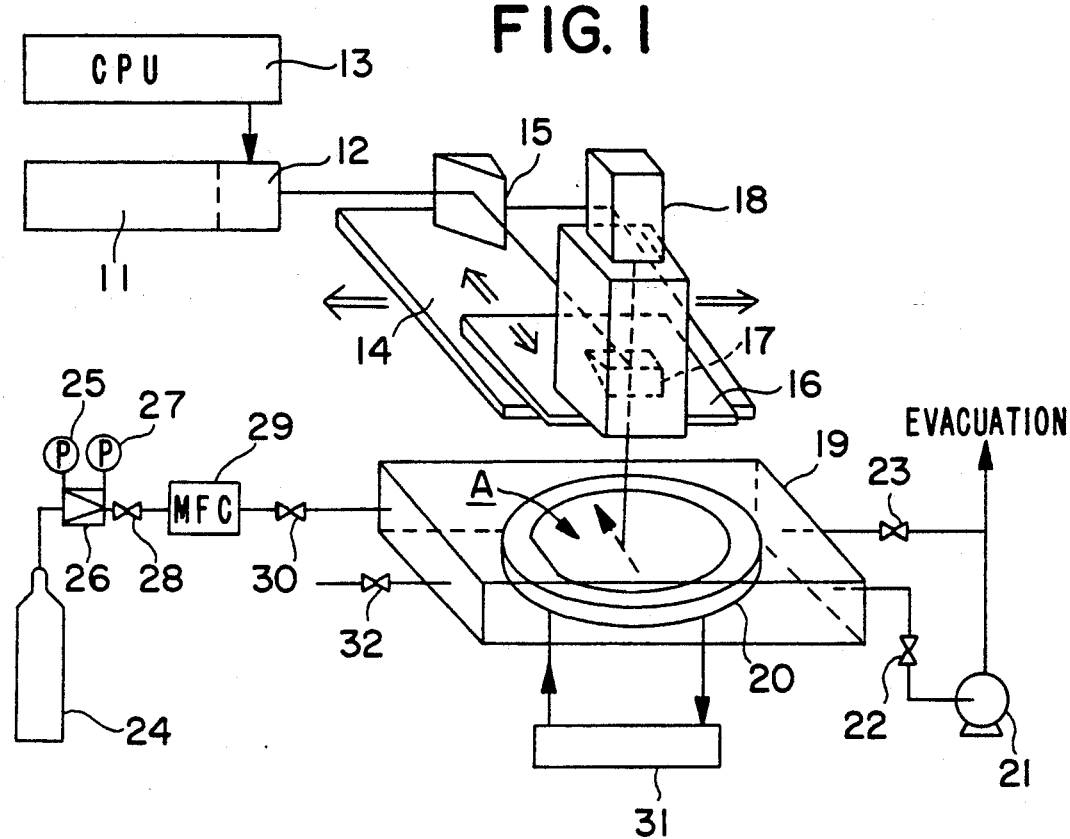
FIG. 1 is a perspective explanatory drawing illustrating in type the general construction of a vapor-phase chemical corrosion reaction device used in Example 1 for embodying the method of the present invention.

As the substrate to be subjected to the method of the present invention for controlling the thickness of the single crystal thin layer in the SOI substrate, a silicon wafer of the bonded SOI construction wherein the degree of dispersion of thickness avoids exceeding the highest level of the existing technique and the smallest thickness of the single crystal layer is not smaller than the required thickness of the single crystal silicon layer is used. In this case, the base wafer may be a single crystal substrate of silicon or a quartz glass substrate.

The method of the present invention starts with measurement of the thickness of the single crystal silicon layer of the bond wafer subjected to the conversion to a thin film throughout the entire surface of the layer.

In preparation for this measurement, the entire surface of the single crystal silicon layer destined to undergo a chemical vapor-phase corroding reaction for the conversion to a thin film and consequently exposed is divided hypothetically and selectively into minute sections as required. Then, the thickness of the single crystal silicon layer in each of the minute sections as sample points is measured.

When the measurement of the thickness of the single crystal silicon layer is made at the rate of one point in each of the minute sections, for example, the thickness is to be taken substantially in the central portion of the minute section. When this measurement is made at the rate of a plurality of points in each of the minute sections, each of the minute sections is further divided into a plurality of sub-sections and the thickness is to be measured substantially in the central portion of each of the sub-sections. Further in the latter case, the average of the thicknesses taken one each in the plurality of sub-sections is to be regarded as representing the thickness of the single crystal silicon layer in the pertinent minute section.

Incidentally, the size of the minute sections mentioned above is set in conformity with the range in which the amount of ultraviolet light used for irradiation can be discretely controlled as described more specifically hereinbelow.

Then, for each of the aforementioned minute sections of the single crystal silicon layer, the amount of vapor-phase corrosion required for the treatment is to be calculated on the basis of the difference between the thickness of the single crystal silicon layer before the chemical vapor-phase corrosion and the thickness of the single crystal silicon layer converted to a required thin film in consequence of the corrosion.

The conversion of the single crystal silicon layer to a thin film is effected by performing a chemical vapor-phase corrosion reaction at least once as adjusted in accordance with the amount of vapor-phase corrosion which is determined based on the result of the measurement of the average layer thickness.

In the method of this invention, the aforementioned minute sections are severally irradiated with the ultraviolet light so as to induce decomposition of fluorine or chlorine molecule or a compound thereof by the action of the ultraviolet light and consequently enabled to generate active seeds containing a fluorine or chlorine radical or a molecule containing the atom which exhibits a chemical vapor-phase corroding action on silicon. The amount of the vapor-phase corrosion to be produced in each of the minute sections can be controlled by adjusting the amount of the ultraviolet light used for irradiation of the minute section. As a result, &he conversion of the single crystal silicon layer to a thin film attained with the dispersion of thickness thereof controlled with high accuracy. The single crystal silicon thin layer effectively retaining the required crystallinity thereof can be formed easily.

Then, in the present invention, when an excimer laser is used for the ultraviolet light, the size of the minute sections is fixed in conformity with the cross-sectional area of the beam of the excimer laser. Thus, the amount of the vapor-phase corrosion produced on the single crystal silicon layer in the relevant minute section can be controlled by the number of pulses of the excimer laser impinging on the minute section.

The light sources which are effectively usable for the emission of the ultraviolet light include a mercury lamp, a halogen lamp, a metal halide lamp, and a mercury-xenon lamp which are invariably capable of continuous light emission (hereinafter referred to collectively as a "ultraviolet lamp"), for example, in addition to the excimer laser. The ultraviolet light is projected on the given surface of the single crystal silicon layer through the medium of a collectin of strips (or matrixes) of shutter (hereinafter referred to briefly as a "mechanical shutter array").

The surface area of each of the minute sections on the surface of the single crystal silicon layer is desired to be slightly larger than the area of the aperture of each component shutter. This is because the chemical corrosion is believed to occur, though slightly, in the non-irradiated part directly bordering on the irradiated part owing to the diffraction of the ultraviolet light by virtue of the shutter and the continuity of the irradiation of light.

Then, owing to the use of the mechanical shutter array configured as described above, the amounts of vapor-phase corrosion occurring in the plurality of minute sections can be simultaneously and independently controlled proportionately to the duration of opening of the shutter arrays. Further by using a plurality of such mechanical shutter arrays instead of just one mechanical shutter array, specifically by using them as arranged after the pattern of a matrix, the required chemical corrosion can be performed as controlled throughout the entire surface of the single crystal silicon layer.

In accordance with the method of the present invention, by further decreasing the thickness of the single crystal silicon layer of the bond wafer in the bonded silicon wafer of the SOI construction which has already undergone the conversion to a thin film, there can be obtained a bonded wafer of the SOI construction which has the aforementioned single crystal silicon layer converted to an extremely thin film measuring $0.50 \pm 0.05$ $\mu$m in thickness, for example.

The single crystal silicon layer of the bond wafer which has not yet undergone the conversion to a thin film by the chemical vapor-phase corrosion reaction is generally produced by the technique available for the production of an SOI wafer and is desired to have a thickness approximately in the range of $0.85 \pm 0.30$ $\mu$m.

Then, the excimer laser to be used in the method of the present invention is a laser possessing a short wavelength falling in the region of ultraviolet light. By the photonic energy generated by the excimer laser, the molecular bond of a fluorine or chlorine molecule or a compound thereof is dissociated with evolution of a radical seed or induction of molecular activation. Since the radical or molecule which has consequently assumed a non-steady state extremely abounds in reactivity, the use thereof realizes the treatment of the silicon surface due to the chemical vapor-phase corrosion reaction. Moreover, since this surface treatment has no use for charged particles having a high energy, it is incapable of inflicting on the crystal substrate such damage as dielectric breakdown which is encountered as in the reactive plasma etching. As a result, the possibility of this treatment entailing deterioration of the crystallinity of the substrate under treatment is eliminated.

Now, the operation to be derived from using an excimer laser as the source for ultraviolet light and a fluorine type gas as the corroding gas will be described as an example.

A bonded wafer of the SOI construction having undergone tentative conversion to a thin film is set in place inside a reaction vessel in such a manner that the bond wafer side thereof is exposed and, at the same time, the reaction vessel is evacuated thoroughly. Then, in the atmosphere of the gas of a fluorine compound, namely in the atmosphere of $NF_3$ gas, $CF_4$ gas, or $SF_6$ gas, under a vacuum pressure in the range of from 10 to 760 torrs, the minute sections set on the bond wafer are severally irradiated with an excimer laser.

Since the excimer lasers being used herein have a uniform intensity of irradiation in the cross section of beam, substantially uniform chemical vapor-phase corrosion reactions occur severally in the minute sections being irradiated with the ultraviolet lights. The amounts of vapor-phase corrosion produced therein, therefore, are substantially uniform.

Moreover, since these excimer lasers have fixed intensity of irradiation, pulse width, and area of irradiation, the amounts of vapor-phase corrosion occurring severally in the minute sections are in direct proportion to the numbers of laser pulses impinging on the minute sections. As a result, the numbers of impinging pulses are automatically fixed by the amounts of necessary corrosion in the minute sections. Thus, the chemical vapor-phase corrosions proceeding therein can be ideally controlled so that the minute sections of the single crystal silicon layer will be given desired thicknesses.

Where a single crystal silicon layer is irradiated with an excimer laser in a normal-pressure atmosphere of $NF_3$ gas, for example, it has been demonstrated by the XPS analysis of the layer surface for the determination of the chemical bond therein that the fluorine atoms resulting from dissociation of $NF_3$ are chemically bonded to the silicon atoms excited on or under the surface of the single crystal silicon layer and, with the irradiation of the excimer laser as a contributory factor, eventually allowed to form $SiF_3$ or $SiF_4$ to complete the vapor-phase corrosion [T. Ogura et al.: "Surface Process in Fluorine-Based Photochemical Etching of Silicon," Extended Abstract of the 18th (1986 International) Conference in Solid State Device & Materials, Tokyo, 1986, pp. 205-208].

The vapor-phase corrosion of the bond wafer by th photochemical reaction requires the light of irradiation to impinge perpendicularly on the surface of the wafer and, by virtue of this perpendicular impingement of the light, allows clear distinction between the part irradiated with the light and the part not irradiated therewith. In this case, virtually no vapor-phase corrosion occurs in the part of the surface not irradiated with the light. As a result, the outstanding characteristics of the method of this invention, specifically extremely small layer thickness and highly accurate control of layer thickness, can be fully manifested. This mechanism clearly conforms with the theory that, in the mechanism of the dry etching due to the excitation of the excimer laser of HCl gas, the chemical vapor-phase corrosion reaction proceeds as the HCl is deposited on the surface and the excitation is induced with the deposited seeds [Mochizuki: "Semiconductor Intergrated Circuit Techonology," the 34th Symposium, 1988, p. 7].

The photochemical reaction described above is required to excite additionally the single crystal silicon bond in the bond wafer of the bonded wafer under treatment as one of the reactants. This fact may possibly explain why the chemical vapor-phase corrosion itself can be limited strictly to the part irradiated with the light.

Since the ultraviolet light participates dually in the adsorption of fluorine atoms on the silicon surface due to dissociation and the formation of released seeds by the reaction of the adsorbed fluorine atoms with silicon atoms, the selective ratio between the part irradiated with the ultraviolet light and the part not irradiated therewith is extremely large in the vapor-phase corrosion reaction on the silicon surface.

As mentioned in the pieces of literature cited above, it has been known that the velocity of the vapor-phase corrosion caused by the use of a fluorine type gas depends sparingly on the electroconductivity of the single crystal silicon substrate and that of the vapor-phase corrosion caused by the use of a chlorine type gas depends on the electroconductivity mentioned above. This clear distinction may be ascribable to the difference in size between the fluorine atom and the chlorine atom and the difference in magnitude of reactivity of these two elements severally with silicon.

In principle, the photochemical reaction caused by the use of an ultraviolet light shows no appreciable difference when the ultraviolet lamp is used or when the excimer laser is used as the source of the ultraviolet light. When the ultraviolet lamp is adopted, since the ultraviolet light from the ultraviolet lamp is continuously supplied, the smount of irradiation with the light energy can be controlled as effectively by adjusting the duration of irradiation through the manipulation of the shutter, for example, as by adjusting the number of pulses of irradiation in the irradiation with the excimer laser.

The cross-sectional shape of the ultraviolet beam from the ultraviolet lamp mentioned above is variable with the shape of the aperture of the shutter to be used. In the present case, the aperture of one shutter corresponds to one minute section set on the single crystal silicon layer. Since the ultraviolet light from the ultraviolet lamp is deficient in the ability to advance straight as compared with the laser beam, the effect of the diffraction of the ultraviolet light by the shutter must be taken into consideration. The size of the minute sections set on the surface of the single crystal silicon layer, therefore, is to be given a slight excess of the size of the shutter aperture.

When the excimer laser is adopted a the source for the ultraviolet light, the individual minute sections to be set of the surface of the bond wafer are fixed by the cross section of the laser beams as described above. When the laser beams have a cross section of $5 \times 5$ mm$^2$, for example, a size of $5 \times 5$ mm$^2$ or a multiple of this size may be selected for the minute sections. When the laser beams have a relatively large cross section, a quotient obtained by dividing the cross section of the laser beams by an integer may be selected for the purpose of decreasing the size of the minute sections. In this case, means for causing laser beams to be simultaneously projected each on a plurality of minute sections and to be moved proportionately to the size of each of the minute sections is adopted.

Then, in the process of converting the bond wafer to an extremely thin film, the thickness of the layer must be measured in advance of the treatment. The measurement of this thickness is desired to be made at points separated by the smallest possible interval in view of the recent trend of the degree of integration of semiconductor integrated circuit elements toward increasing density. To be specific, this interval must be at least equal to or preferably smaller than the size of the minute sections.

The interference spectroscopy, for example, may be adopted for the measurement of the thickness of the single crystal silicon layer. This interference spectroscopy has been so well known to date as obviate the necessity for any explanation. The light to be used for this method can be selected in a wide range from the ultraviolet region through the near infrared region. For the method of this invention, the light in the visible light region or in the near infrared region is favorably used because the ultraviolet light is used for the photochemical vapor-phase corrosion. In this case, the measurement of the thickness of the bondwafer ca be performed simultaneoulsy with the chemical vapor-phase corrosion reaction and, therefore, the progress of the chemical vapor-phase corrosion reaction and the end point thereof can be comprehended accurately.

As a consequence of the operation described above, the method of the present invention enables the work for the conversion to an extremely thin film to be carried out with the dispersion of thickness of the single crystal silicon layer controlled with high accuracy and permits exact and easy formation of a single crystal silicon thin film effectively retaining desired crystallinity.

EXAMPLE

Now, the method of the present invention for controlling the thickness of a single crystal thin film in the SOI substrate will be described more specifically below with reference to working examples.

The first embodiment using a laser beam as the source for ultraviolet light will be described with reference to FIG. 1 and FIG. 2.

In the method of this embodiment, an excimer laser ArF (wavelength 193 nm) having a pulse generation frequency of up to 100 pps, a spot size of $5 \times 10$ mm$^2$, and an energy density of up to 5 W/cm$^2$ was used as the source for a laser beam. A bond wafer of n type $<100>$, 10 $\Omega$. cm having a diameter of 125 mm and an average thickness of $0.81 \pm 0.3$ $\mu$m was used.

Prior to the start of the treatment by corrosion, the entire surface of the bond wafer was hypothetically divided into minute sections each of the square of 5 mm (25 mm$^2$) and the thickness of the single crystal silicon layer was measured in the central part of each of the minute sections to determine the amounts of corrosion necessary for the conversion. The data thus obtained were stored in the CPU for the control of the device.

The general construction of the device for vapor-phase chemical corrosion reaction to be used for the method of this embodiment is illustrated by type in FIG. 1.

In the construction of FIG. 1, an excimer laser 11 was provided with a mechanical shutter 12. This mechanical shutter 12 was opened or shut as controlled by CPU 13 which was adapted to control the device as a whole. On the light path of the excimer laser 11, an X-direction movable stage 14 furnished with a mirror 15 and a y-direction movable stage 16 furnished with a half mirror 17 were disposed. By the use of unshown step motors, these movable stages 14, 16 were moved with a pitch of 5 mm in the indicated directions as duly controlled and then kept stopped at the position for prescribed duration. Above the half mirror 17 was disposed a monitor camera 18 adapted to permit inspection of the movement of the movable stages 14, 16 and the progress of the chemical vapor-phase corrosion reaction which will be described more specifically hereinbelow.

Below the half mirror 17 was disposed a sample cell 19 made of transparent quartz and intended to serve as a reaction vesses. On a sample base 20 installed inside the sample cell 19, a single crystal silicon layer subjected to the treatment, specifically a semiconductor wafer A possessed of a bond wafer B surface having t he aforementioned minute sections set thereon was mounted fast. In this arrangement, an excimer laser beam passed through the half mirror 17 was projected as expected.

To the sample cell 19, a vacuum pump 21 was connected via a switch valve 22 and an exhaust system was connected via a switch valve 23. Thus, the sample cell 19 could be evacuated thoroughly. The reaction gas, specifically a $NF_3$ gas in the present case, from a gas cylinder 24 could be supplied into the sample cell via a reducing valve 26, switch valve 28, a mass flow controller 29, and a switch valve 30 under the control of pressure gauges 25, 27. The treating temperature of the semiconductor wafer A could be adjusted by means of a temperature regulating device 31.

The reference numeral 32 stands for leak valve.

In the method of the present embodiment, the atmosphere enclosing the wafer was displaced by evacuation with $NF_3$ gas at 1atm and the wafer temperature was kept at $100°\pm5°$ C. By a preparatory experiment, the amount of chemical vapor-phase corrosion under the aforementioned conditions was found to be 0.033 nm/pulse.

Figure 2:
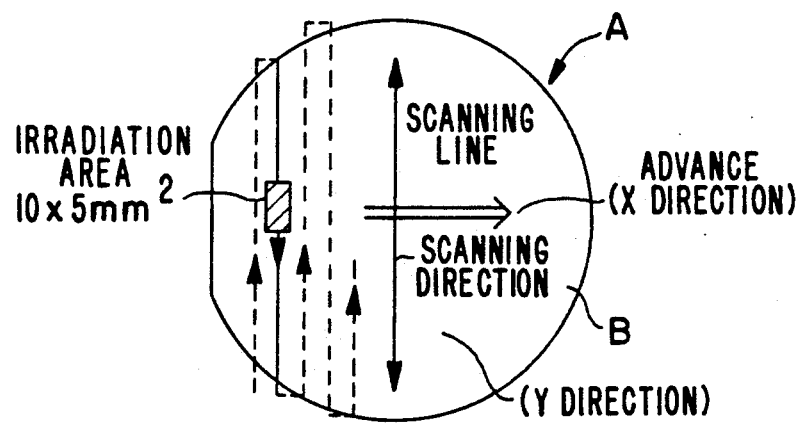
FIG. 2 is an explanatory drawing illustrating the manner of irradiation of a single crystal silicon layer with the ultraviolet light as used similarly.

Here, the vapor-phase chemical corrosion reaction on the bond wafer B surface, and consequently on the surfaces of the minute sections b, in the aforementioned semiconductor wafer A was carried out by causing the laser beam to advance in the direction of its major side as illustrated in FIG. 2 so as to scan the bond wafer B surface.

Now, one example of the work of the conversion of the single crystal silicon layer to an extremely thin film by corrosion in the method of the first embodiment will be described below.

The size of this laser spot was $5\times10$ $mm^2$ and embraced two of the aforementioned minute sections b. First, one section along the edge of the wafer (first section) alone was irradiated with the ultraviolet light. The number of pulses of the irradiating light was controlled by the duration of irradiation based on the amounts of required corrosion for the minute sections b stored in the CPU 13. Then, the minute sections b under treatment were moved by a pitch equivalent to one minute section and again subjected to the irradiation with the ultraviolet light. Thus, the first and second sections underwent the vapor-phase chemical corrosion reaction. In this case, the number of pulses of the irradiating light was adjusted so that the thickness of the single crystal silicon layer in the first section would fall at the prescribed value. Subsequently, the second and third sections were selected as the parts to be irradiated with the ultraviolet light. Thereafter, the vapor-phase chemical corrosion reaction was similarly continued until one line was completed. The minute sections to be irradiated were moved from the first line to the next line to repeat the procedure described above. In this manner, the vapor-phase chemical corrosion reaction was performed on the entire surface.

Table 1 shows the thicknesses of the single crystal silicon layer before irradiation in the minute sections in the laser scanning line in the central part of the wafer, the estimated amounts of corrosion for the individual sites of irradiation with the laser beam and the sequences of irradiation, and the thicknesses of the single crystal silicon layer after irradiation in the minute sections.

TABLE 1

| Minute section No. | \multicolumn{13}{c|}{Thickness in $\mu m$} |
|---|---|---|---|---|---|---|---|---|---|---|---|---|---|
|  | 1 | 2 | 3 | 4 | 5 | 6 | 7 | 8 | 9 | 10 | 11 | 12 | 13 |
| Thickness measured before irradiation | 0.87 | 0.90 | 0.92 | 0.96 | 1.03 | 1.07 | 1.08 | 1.06 | 1.02 | 1.06 | 0.92 | 0.88 | 0.84 |
| Estimated amount of corrosion | 0.19 (1) | | 0.22 (3) | | 0.26 (5) | | 0.30 (7) | | 0.28 (9) | | 0.22 (11) | | 0.18 (13) |
| (sequence of irradiation) | | 0.16 (2) | | 0.18 (4) | | 0.25 (6) | | 0.26 (8) | | 0.22 (10) | | 0.18 (12) | 0.13 (14) |
| Thickness measured after irradiation | 0.52 | 0.52 | 0.53 | 0.53 | 0.54 | 0.53 | 0.54 | 0.55 | 0.54 | 0.53 | 0.52 | 0.51 | 0.52 |

| Minute section No. | \multicolumn{12}{c|}{Thickness in $\mu m$} |
|---|---|---|---|---|---|---|---|---|---|---|---|---|
|  | 14 | 15 | 16 | 17 | 18 | 19 | 20 | 21 | 22 | 23 | 24 | 25 |
| Thickness measured before irradiation | 0.77 | 0.73 | 0.67 | 0.63 | 0.60 | 0.56 | 0.53 | 0.52 | 0.60 | 0.70 | 0.65 | 0.60 |
| Estimated amount of corrosion | | 0.12 (15) | | 0.06 (17) | | 0.03 (19) | | 0.00 (21) | | 0.08 (23) | | 0.03 (25) |
| (sequence of irradiation) | 0.13 (14) | | 0.09 (16) | | 0.05 (18) | | 0.01 (20) | | 0.00 (22) | | 0.10 (24) | 0.05 (25) |
| Thickness measured after irradiation | 0.53 | 0.52 | 0.51 | 0.52 | 0.51 | 0.50 | 0.51 | 0.51 | 0.50 | 0.51 | 0.53 | 0.53 |

In this case, the single crystal silicon layer which had undergone conversion to an extremely thin film was polished to a mirror finish. The surface irregularities of this thin film, determined with a contact type surface shape tester, were found to be not more than 0.01 $\mu m$ in the direction of laser beam scanning and in the direction perpendicular thereto.

Then the second embodiment using an ultraviolet lamp as the source for an ultraviolet light will be described below with reference to FIG. 3 to FIG. 5.

Figure 3:
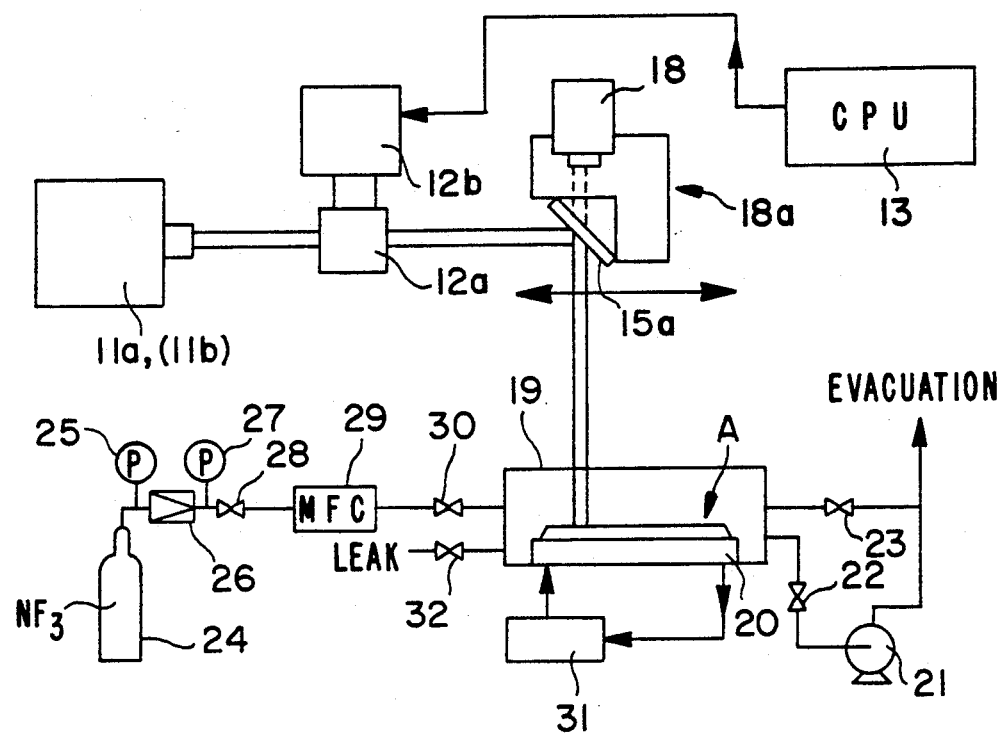
FIG. 3 is a perspective explanatory drawing illustrating in type the general constructin of a vapor-phase chemical corrosion reaction device used in Example 2 for embodying the method of the present invention.
Figure 4:
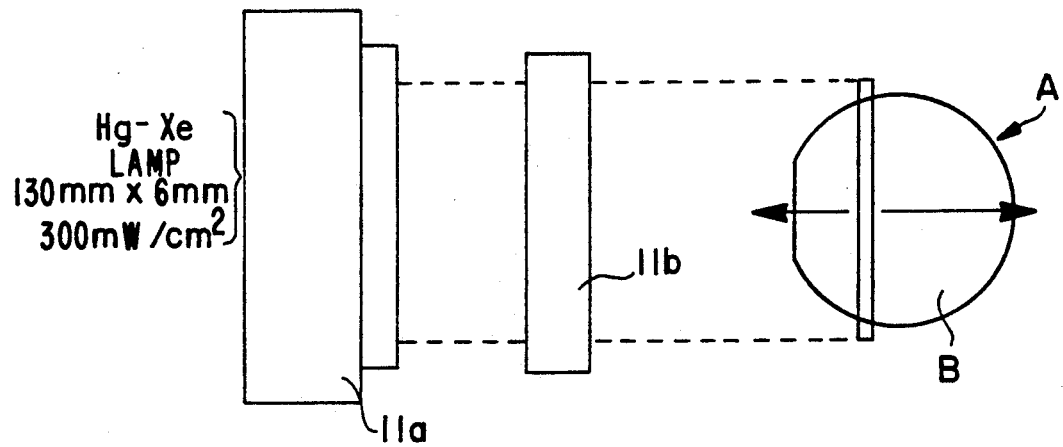
FIG. 4 is an explanatory drawing illustrating the manner of irradiation of the same single crystal silicon layer as described above with the ultraviolet light.

The construction of a device used in the method of this embodiment, as shown in FIG. 3, was substantially equal to the that of device used in the preceding example.

A Hg-Xe lamp 11a was used as the source for ultraviolet light. From this light source 11a, a luminous flux having a light energy of 300 $mW/cm^2$ and a light path cross section of the shape of a sheet $130\times6$ $mm^2$ in size was emitted through a suitable optical system 11b. Within the light path of the sheetlike luminous flux was installed a mechanical shutter array 12 a which comprised a total of 21 unit shutters 12c having a unit aperture of 5×5 mm² as illustrated in FIG. 4 and spaced linearly at intervals of 1 mm. Component step motors 12d of a mechanical shutter driver 12b illustrated in FIG. 5 were adapted to open and shut the corresponding unit shutter 12c as adjusted independently. Thus, the amount of passing light and consequently the amount of irradiating light were rendered controllable.

The aforementioned sheetlike luminous flux of ultraviolet light was controlled to the amount of irradiation corresponding to each of the minute sections b having an area of 6×6 mm² and set as hypothetically selected single crystal silicon layer in the bond wafer B. Subsequently, the wafer A was removed from the sample cell, subjected to the measurement of the thickness of the sinlge crystal silicon layer thereof, and again subjected to the vapor-phase chemical corrosion reaction. The procedure was carried out a total of five times.

Table 2 shows the thicknesses of the single crystal silicon layer measured in the central portion of each of the minute sections in one line of irradiation with the ultraviolet light in the central part of the wafer severally before the irradiation, after the first irradiation, and after the fifth irradiation.

TABLE 2

| Minute section No. | Thickness in $\mu m$ | | | | | | | | | | |
|---|---|---|---|---|---|---|---|---|---|---|---|
| | 1 | 2 | 3 | 4 | 5 | 6 | 7 | 8 | 9 | 10 | 11 |
| Before irradiation | 0.60 | 0.62 | 0.62 | 0.64 | 0.68 | 0.71 | 0.74 | 0.77 | 0.80 | 0.82 | 0.83 |
| After first irradiation | 0.59 | 0.59 | 0.59 | 0.61 | 0.65 | 0.67 | 0.69 | 0.72 | 0.74 | 0.75 | 0.77 |
| After fifth irradiation | 0.48 | 0.47 | 0.47 | 0.48 | 0.48 | 0.49 | 0.50 | 0.49 | 0.50 | 0.51 | 0.52 |

| Minute section No. | Thickness in $\mu m$ | | | | | | | | | |
|---|---|---|---|---|---|---|---|---|---|---|
| | 12 | 13 | 14 | 15 | 16 | 17 | 18 | 19 | 20 | 21 |
| Before irradiation | 0.85 | 0.88 | 0.94 | 1.02 | 1.08 | 1.12 | 1.12 | 1.08 | 1.05 | 0.93 |
| After first irradiation | 0.79 | 0.81 | 0.86 | 0.92 | 0.97 | 1.01 | 1.01 | 0.98 | 0.95 | 0.84 |
| After fifth irradiation | 0.52 | 0.52 | 0.53 | 0.53 | 0.53 | 0.55 | 0.56 | 0.54 | 0.52 | 0.50 |

| Minute section | Average | |
|---|---|---|
| Before irradiation | 0.85 | +0.27 / −0.25 |
| After first irradiation | 0.79 | +0.22 / −0.20 |
| After fifth irradiation | 0.51 | +0.05 / −0.04 | on the bond wafer B by causing the luminous flux to be moved with pitches of 6 mm at a fixed time interval. This procedure was repeated until the entire surface of the bond wafer B was irradiated with the luminous flux.

Here, the time for keeping the unit shutter 12c open was controlled by the amount of nesessary corrosion calculated by the CPU 13 based on the data of the thickness of the single crystal silicon layer in the minute section b mentioned above. A movable mirror 15a disposed on a movable stage 14a on the light path was caused to project the sheetlike luminous flux of ultraviolet light on the bond wafer B in the same manner as in the preceding embodiment and, at the same time, moved by the movable stage 14a and then retained at the new position for a fixed length of time.

Now, an example of the work of effecting the conversion of the single crystal silicon layer to an extremely thin film by corrosion in the case of the method of the second embodiment will be described below.

The bond wafer B in this case was of a p type <100>, 5 Ω cm given an average thickness of 0.85 μm by polishing and possessed of a diameter of 125 mm. The thickness of the single crystal silicon layer was measured in the central portion of each of the minute sections b 6×6 mm² in size. The numerical data consequently obtained by this measurement were stored in the CPU 13. The atmosphere enclosing the wafer inside the sample cell 19 was displaced by evacuation with NF₃ gas at 1 atm. The time of irradiation with the sheetlike luminous flux of ultraviolet light in one line was set at 10 sec and time for keeping the shutter open was adjusted proportionately to the amount of necessary corrosion for each of the minute sections be existing in that line.

In the ensuant state, the vapor-phase chemical corrosion reaction was performed on the entire surface of the As described in detail above, the method of this invention for controlling the thickness of a single crystal silicon layer bonded on a dielectric substrate for the sake of conversion of the single crystal silicon layer to a thin film comprises selectively and hypothetically dividing the entire surface of the single crystal silicon layer destined to undergo a chemical corrosion reaction for the conversion to a thin film into minute sections as required in advance of the chemical corrosion reaction and, at the same time, measuring the thickness of the single crystal silicon layer in each of the minute sections, and irradiating each of the minute sections with a violet light in the amount adjusted in accordance with the measured thickness of the layer under an atmosphere of a reaction gas of the fluorine type or chlorine type thereby causing fluorine or chlorine molecules or a compound thereof to be decomposed by the irradiation with the ultraviolet light and inducing generation of active seeds of fluorine or chlorine radicals or of molecules containing such atoms and consequently effecting the conversion of the single crystal silicon layer to a thin film by the chemical corrosion reaction. Thus, the conversion to a thin film is attained with the dispersion of thickness of the single crystal silicon layer controlled with high accuracy and the production of a single crystal silicon thin-film layer effectively retaining required crystallinity is accomplished easily.

What is claimed is:

1. A method for controlling the thickness of a single crystal thin-film silicon layer bonded on a dielectric substrate in a SOI substrate thereby effecting conversion of said single crystal silicon layer to a thin film, comprising:

dividing the entire surface of said single crystal silicone layer destined to undergo a chemical vapor-phase corrosion reaction for the sake of said conversion into necessary minutes sections;

taking preparatory measurement of the thickness of said single crystal silicon layer in each of said minute sections;

effecting on each of said minute sections said conversion to a thin film by a chemical vapor-phase corrosion reaction adjusted in accordance with the measured thickness of layer; and attaining control of the dispersion of thickness of said thin-film layer with high accuracy.

2. A method according to claim 1, wherein said measurement of the thickness of said single crystal silicon layer and said adjusted chemical vapor-phase corrosion are repeated a plurality of times.

3. A method according to claim 1, wherein said dielectric substrate is quartz glass substrate.

4. A method according to claim 1, wherein said dielectric substrate is a silicon substrate having a thermal oxide film formed thereon and another single crystal substrate bonded thereto through the medium of said thermal oxide film is subjected on the exposed surface side thereof to said chemical vapor-phase corrosion for the sake of said conversion to a thin film.

5. A method according to claim 1, wherein as single crystal or polycrystalline silicon substrate is used in the place of said dielectric substrate, bonding to said single crystal or polycrystalline silicon substrate a single crystal silicon substrate having a thermal oxide film formed thereon, subsequently to said bonding, removing said oxide film from the exposed surface of said latter single crystal silicon substrate, and subjecting the exposed surface of said single crystal layer to a chemical vapor-phase corrosion for the sake of said conversion to a thin film.

6. A method according to claim 1, wherein said chemical reaction is adapted to generate fluorine or chlorine radicals by irradiation of an ultraviolet light and said conversion of said single-crystal silicon layer is effected by said chemical vapor-phase corrosion reaction induced by said fluorine or chlorine radicals.

7. A method according to claim 6, wherein an excimer laser is used as said ultraviolet light and the amount of vapor-phase corrosion of said single crystal silicon substrate by said chemical vapor-phase corrosion reaction on the laser-irradiated surface is controlled by the number of irradiating pulse of said laser.

8. A method according to claim 6, wherein one member selected from the group consisting of mercury lamp, halogen lamp, metal halide lamp, and mercury-xenon lamp is used as the source for said ultraviolet light, adjusting the time for irradiation with the ultraviolet light from said lamp by controlling the opening and shutting of a mechanical shutter serving a relevant minute section, and controlling the amount of vapor-phase corrosion of said single crystal silicon substrate by adjusting said chemical vapor-phase corrosion reaction proceeding on a relevant minute section in consequence of said irradiation with the light.

9. A method for controlling the thickness of a single crystal thin-film silicon layer bonded on a dielectric substrate in a SOI substrate thereby effecting conversion of said single crystal silicon layer to a thin film comprising:

dividing the entire surface of said single crystal silicon layer destined to undergo a chemical vapor-phase corrosion reaction for the sake of said conversion into necessary minute sections;

taking preparatory measurement of the thickness of said single crystal silicon layer in each of said minute sections;

effecting on each of said minute sections said conversion to a thin film by a chemical vapor-phase corrosion reaction adjusted in accordance with the measured thickness of layer;

thereby attaining control of the dispersion of thickness of said thin-film layer with high accuracy;

adapting said chemical reaction to generate fluorine or chlorine radicals by irradiation of an ultraviolet light;

connecting said single crystal silicon layer by said chemical vapor-phase corrosion reaction induced by said fluorine or chlorine radicals;

selecting one member from the group consisting of mercury lamp, halogen lamp, metal halide lamp, and mercury-xenon lamp as the source for said ultraviolet light;

adjusting the time for irradiation with the ultraviolet light from said lamp by controlling the opening and shutting of a mechanical shutter serving a relevant minute section;

controlling the amount of vapor-phase corrosion of said single crystal silicon substrate by adjusting said chemical vapor-phase corrosion reaction proceeding on a relevant minute section in consequence of said irradiation with the light;

using an excimer laser for said ultraviolet light;

controlling the amount of vapor-phase corrosion of said single crystal silicon substrate by said chemical vapor-phase corrosion reaction on the laser-irradiated surface by the number of irradiating pulsed of said laser, and repeating a plurality of times the measurement of the thickness of said single crystal silicon layer and said adjusted chemical vapor-phase corrosion.

10. A method according to claim 9, wherein said dielectric substrate is quartz glass substrate.

11. A method according to claim 9, wherein said dielectric substrate is a silicon substrate having a thermal oxide film formed thereon and another single crystal substrate bonded thereto through the medium of said thermal oxide film is subjected on the exposed surface side thereof to said chemical vapor-phase corrosion for the sake of said conversion to a thin film.

12. A method according to claim 9, wherein a single crystal or polycrystalline silicon substrate is used in the place of said dielectric substrate, bonding to said single crystal of polycrystalline silicon substrate a single crystal silicon substrate having a thermal oxide film formed thereon, subsequently to said bonding, removing said oxide film from the exposed surface of said latter single crystal silicon substrate, and subjecting the exposed surface of said single crystal layer to a chemical vapor-phase corrosion for the sake of said conversion to a thin film.

* * * * *